(12) United States Patent
Gupta et al.

(10) Patent No.: US 7,453,070 B2
(45) Date of Patent: Nov. 18, 2008

(54) METHODS AND APPARATUS FOR BEAM DENSITY MEASUREMENT IN TWO DIMENSIONS

(75) Inventors: Atul Gupta, Beverly, MA (US); Joseph C. Olson, Beverly, MA (US); Gregg A. Norris, Rockport, MA (US)

(73) Assignee: Varian Semiconductor Associates, Inc., Gloucester, MA (US)

(*) Notice: Subject to any disclaimer, the term of this patent is extended or adjusted under 35 U.S.C. 154(b) by 272 days.

(21) Appl. No.: 11/477,335

(22) Filed: Jun. 29, 2006

(65) Prior Publication Data
US 2008/0073550 A1 Mar. 27, 2008

(51) Int. Cl.
G01K 1/08 (2006.01)
(52) U.S. Cl. .............. 250/397; 250/492.21; 250/491.1; 427/523; 362/284; 362/324; 353/97
(58) Field of Classification Search ............. 250/396 R, 250/397, 492.21, 423 R, 491.1; 362/284, 362/322, 324; 353/97; 427/8, 523
See application file for complete search history.

(56) References Cited
U.S. PATENT DOCUMENTS 5,282,121 A * 1/1994 Bornhorst et al. .......... 362/294

| 7,026,628 B2 * | 4/2006 | Krueger ...................... 250/397 |
| 2002/0121889 A1 | 9/2002 | Larsen et al. |
| 2005/0191409 A1 | 9/2005 | Murrell et al. |
| 2006/0006346 A1 | 1/2006 | Rathmell et al. |
| 2006/0219936 A1 | 10/2006 | Olson et al. |

FOREIGN PATENT DOCUMENTS

WO 2006107726 A1 10/2006
WO 2007087209 A1 8/2007

* cited by examiner

Primary Examiner—Haissa Philogene

(57) ABSTRACT

A beam density measurement system includes a shield, a beam sensor, and an actuator. The beam sensor is positioned downstream from the shield in a direction of travel of a beam. The beam sensor is configured to sense an intensity of the beam, and the beam sensor has a long dimension and a short dimension. The actuator translates the shield relative to the beam sensor, wherein the shield blocks at least a portion of the beam from the beam sensor as the shield is translated relative to the beam sensor, and wherein measured values of the intensity associated with changes in a position of the shield relative to the beam sensor are representative of a beam density distribution of the beam in a first direction defined by the long dimension of the beam sensor.

20 Claims, 14 Drawing Sheets ized in an ion source, the ions are accelerated to form an ion beam of prescribed energy and the ion beam is directed at a front surface of the substrate. A common example is the change in electrical conductivity of a semiconducting material through the implantation of impurities such as boron, arsenic, etc. The energetic ions in the beam penetrate into the bulk of the semiconductor material and are embedded into the crystalline lattice of the semiconductor material to form a region of desired conductivity.

METHODS AND APPARATUS FOR BEAM DENSITY MEASUREMENT IN TWO DIMENSIONS

FIELD

This application relates to methods and apparatus for beam density measurement in two dimensions.

BACKGROUND

Ion implantation is a standard technique for introducing property-altering impurities into various substrates. A desired impurity material is ionized in an ion source, the ions are accelerated to form an ion beam of prescribed energy and the ion beam is directed at a front surface of the substrate. A common example is the change in electrical conductivity of a semiconducting material through the implantation of impurities such as boron, arsenic, etc. The energetic ions in the beam penetrate into the bulk of the semiconductor material and are embedded into the crystalline lattice of the semiconductor material to form a region of desired conductivity.

An ion implanter usually includes an ion source for converting a gas or a solid material into an ionized plasma from which a well-defined ion beam is extracted through the use of well established ion beam extraction electrodes. The ion beam may be mass analyzed to eliminate undesired ion species, accelerated to a desired energy and directed onto a target plane. The ion beam may be distributed over the target area by beam scanning, by target movement or by a combination of beam scanning and target movement. The ion beam may be a spot beam or a ribbon beam having a long dimension and a short dimension. The long dimension may be at least as wide as the substrate.

Introducing the impurities at a desired density into the substrates is important to ensure that the semiconductor device being formed operates within specification. One factor that can affect the dose into the substrate is the ion beam current distribution within the ion beam. Accordingly, conventional ion beam current density measurement systems have been developed. One conventional ion beam current density measurement system translates a profiler sensor, e.g., a Faraday sensor as is known in the art, in a fixed direction through the ion beam. The measured beam current may be correlated to a known position of the traveling profiler sensor to provide an ion beam current distribution of the ion beam in one dimension. A drawback with this conventional approach is that it is limited to ion beam current density measurements in one dimension only, e.g., in the direction of travel of the traveling profiler sensor.

Another conventional ion beam current density measurement system is capable of measuring ion beam current density distribution in two dimensions by adding a plurality of pixels to the beam sensor. Each of the plurality of pixels operates as a beam current sensor and in one embodiment there may be two offset columns of pixels of about six pixels per column on a traveling profiler sensor. The traveling profiler has the advantage of using fewer pixels to get the beam density over a large area whereas a stationary set of pixels has a much reduced spatial resolution for the same number of pixels. However, a drawback with this approach is the cost and complexity of the additional pixels and associated wiring for each pixel. In addition, the pixels and associated wiring require space in an area of the ion implanter where there is a premium on such space. For example, it may be beneficial to translate the traveling profiler sensor outside the process chamber after measurements are taken. An associated opening in the process chamber may not be large enough to permit a large number of pixels and associated wiring to be coupled to the traveling profiler sensor.

Accordingly, there is a need in the art for a new and improved beam density measurement system for measuring beam density in two dimensions.

SUMMARY

According to a first aspect of the invention, a beam density measurement system is provided. The beam density measurement system includes a shield and a beam sensor. The beam sensor is positioned downstream from the shield in a direction of travel of a beam. The beam sensor is configured to sense an intensity of the beam and the beam sensor has a long dimension and a short dimension. The beam density measurement system further includes an actuator to translate the shield relative to the beam sensor, wherein the shield blocks at least a portion of the beam from the beam sensor as the shield is translated relative to the beam sensor, and wherein measured values of the intensity associated with changes in a position of the shield relative to the beam sensor are representative of a beam density distribution of the beam in a first direction defined by the long dimension of the beam sensor.

According to another aspect of the invention, an apparatus is provided. The apparatus includes a beam generator configured to generate a beam, and a beam density measurement system. The beam density measurement system includes a shield and a beam sensor. The beam sensor is positioned downstream from the shield in a direction of travel of the beam. The beam sensor is configured to sense an intensity of the beam and the beam sensor has a long dimension and a short dimension. The beam density measurement system further includes an actuator to translate the shield relative to the beam sensor, wherein the shield blocks at least a portion of the beam from the beam sensor as the shield is translated relative to the beam sensor, and wherein measured values of the intensity associated with changes in a position of the shield relative to the beam sensor are representative of a beam density distribution of the beam in a first direction defined by the long dimension of the beam sensor.

According to yet another aspect of the invention, a method is provided. The method includes providing a beam sensor positioned downstream from a shield in a direction of travel of a beam, the beam sensor having a long dimension and a short dimension, translating the shield relative to the beam sensor so that the shield blocks at least a portion of the beam from the beam sensor, and measuring an intensity of the beam with the beam current sensor for different positions of the shield relative to the beam sensor, wherein measured values of the intensity associated with changes in a position of the shield relative to the beam sensor are representative of a beam density distribution of the beam in a first direction defined by the long dimension of the beam sensor.

BRIEF DESCRIPTION OF THE DRAWINGS

For a better understanding of the present disclosure, reference is made to the accompanying drawings in which.

DETAILED DESCRIPTION

Figure 1A:
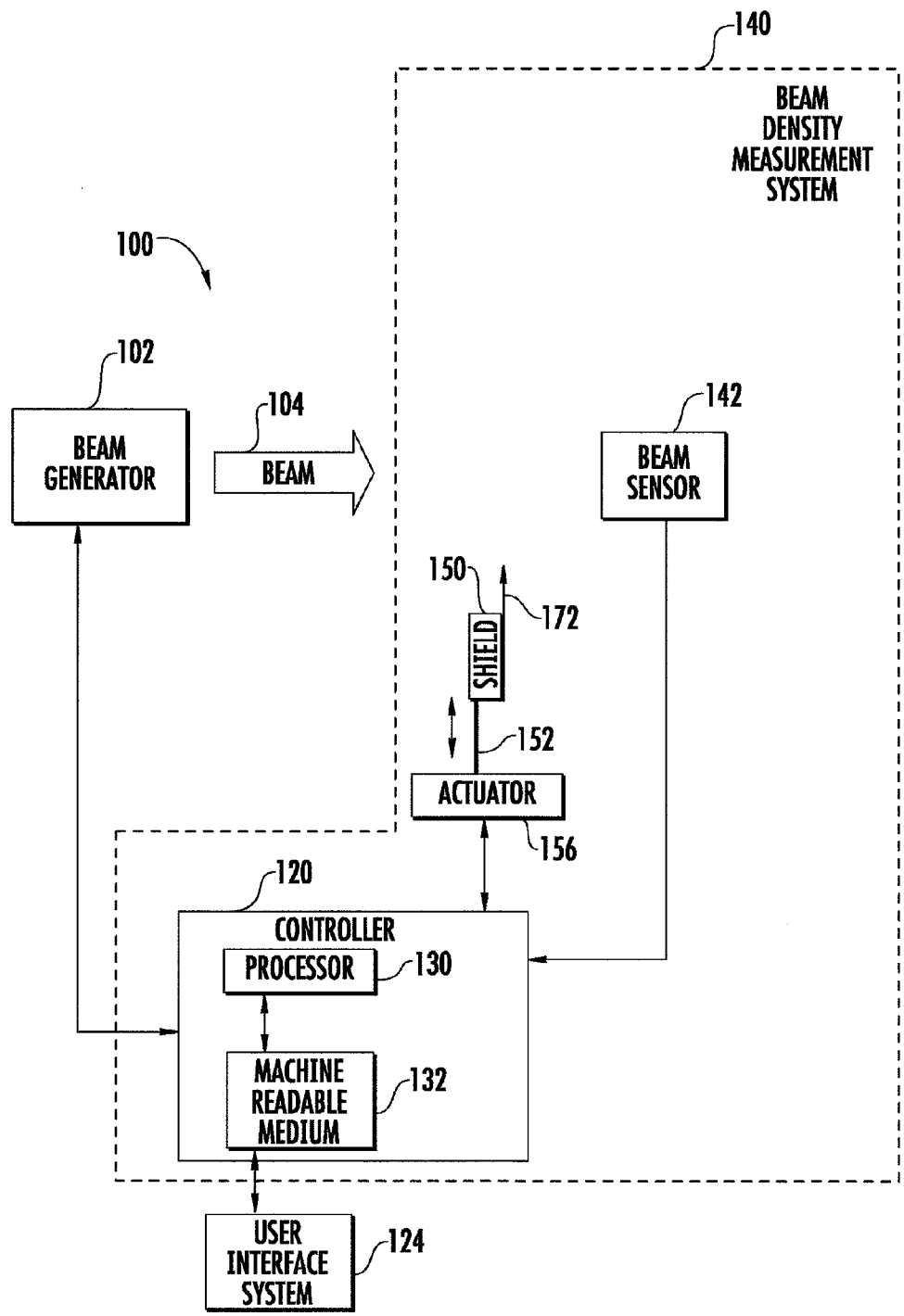
FIG. 1A is a simplified schematic diagram of an apparatus including a beam generator and a beam density measurement system in accordance with an embodiment of the invention.

FIG. 1A illustrates a block diagram of an apparatus 100 including a beam generator 102 and a beam density measurement system 140 consistent with an embodiment of the invention. The beam generator 102 can include various types of components and system to generate a beam 104. The beam can include, but not be limited to, an ion beam, a light beam, an electron beam, and a neutral particle beam.

The beam density measurement system 140 may include a shield 150, an actuator 156, a beam sensor 142, and a controller 120. The shield 150 may be fabricated of a variety of materials in order to selectively block the beam 104. The actuator 156 may include one or more motors, drive mechanisms, mechanical linkages, and any other components as are known in the art. The actuator 156 may translate the shield 150 relative to the beam sensor 142 by translating the shield 150, the beam sensor 142, or some combination of both. In one embodiment, the actuator 156 may translate the shield along the translation path 172 and the actuator 156 may be coupled to the shield 150 via a connecting rod 152 as illustrated in FIG. 1.

The beam sensor 142 is positioned downstream from the shield 150 in a direction of travel of the beam 104. The beam sensor 142 is configured to sense an intensity of the particular beam 104 incident thereon. Therefore, the beam sensor 142 may differ with the type of beam 104. For instance, the beam sensor 142 may be a beam current sensor such as a Faraday sensor if the beam 104 is an ion beam. The beam sensor 142 may also be a light sensor such as a photodetector if the beam 104 is a light beam, a neutral particle detector if the beam 104 is a neutral particle beam, etc.

The controller 120 can be or include a general-purpose computer or network of general-purpose computers that may be programmed to perform desired input/output functions. The controller 120 may include a processor 130 and a machine readable medium 132. The processor 130 may include one or more processors known in the art such as those commercially available from Intel Corporation. The machine readable medium 132 may include on or more machine readable storage media such as random-access memory (RAM), dynamic RAM (DRAM), magnetic disk (e.g., floppy disk and hard drive), optical disk (e.g., CD-ROM), and/or any other device that can store instructions for execution. The controller 120 can also include other electronic circuitry or components, such as application specific integrated circuits, other hardwired or programmable electronic devices, discrete element circuits, etc. The controller 120 may also include communication devices. The controller 120 may receive input data and instructions from any variety of systems and components of the apparatus 100 and provide output signals to control the components of the apparatus 100.

The apparatus 100 may also include a user interface system 124. The user interface system 124 may include, but not be limited to, devices such as touch screens, keyboards, user pointing devices, displays, printers, etc. to allow a user to input commands and/or data and/or to monitor the apparatus 100 via the controller 120.

Figure 1B:
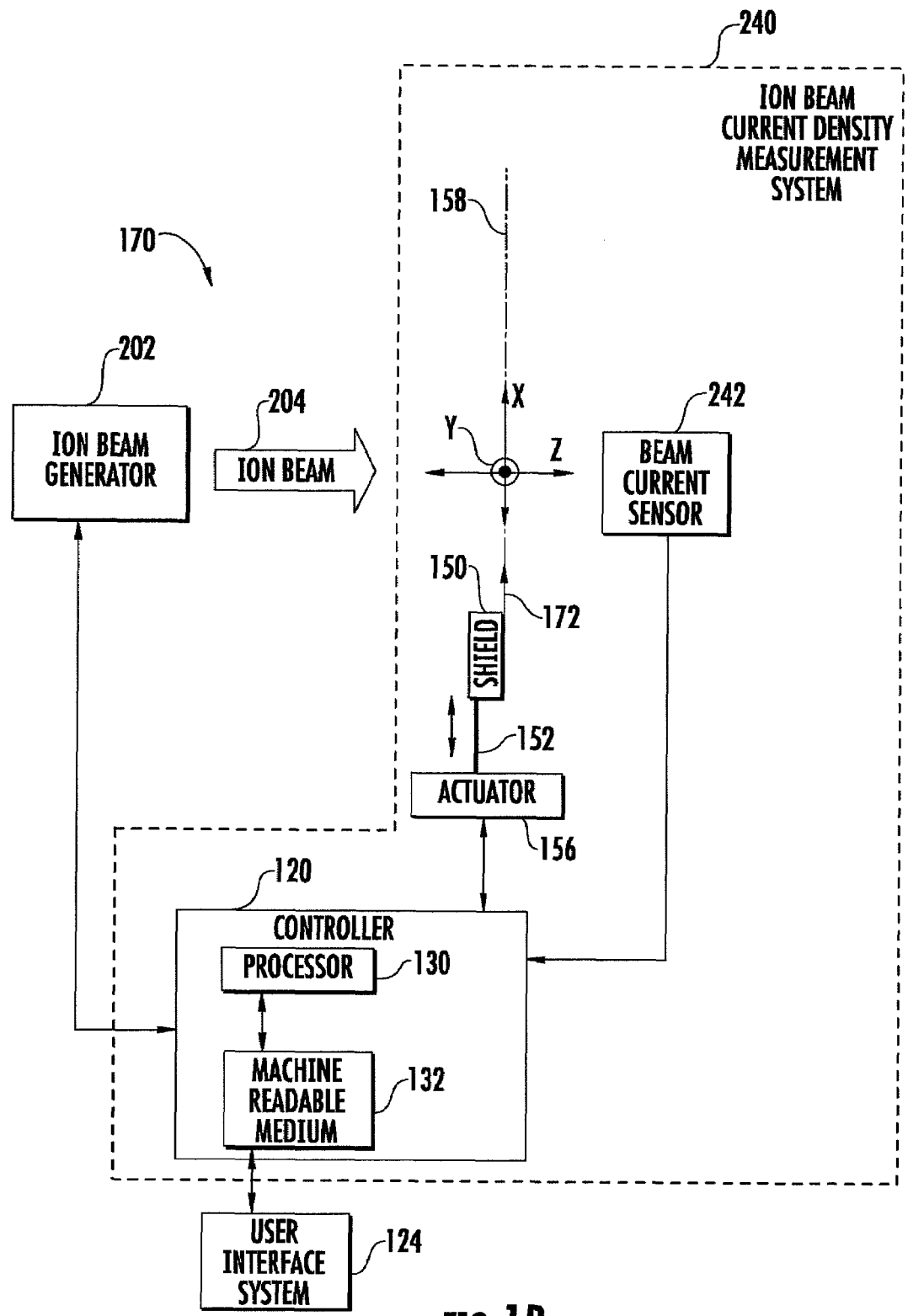
FIG. 1B is a schematic diagram consistent with FIG. 1A where the apparatus is an ion implanter.

Turning to FIG. 1B, a schematic diagram consistent with FIG. 1A where the apparatus 100 is an ion implanter 170 is illustrated. The invention is described further herein in connection with ion implanters having an ion beam current density measurement system 240. However, the invention can be used to sense the beam density distribution of any type of beam. Thus, the invention is not limited to the specific embodiments described herein. Components of FIG. 1B similar to components of FIG. 1A are similarly labeled and hence any repetitive description is omitted herein for clarity.

The beam generator 102 may be an ion beam generator 202 configured to generate an ion beam 204. The ion beam current density measurement system 240 may include a beam current sensor 242 to measure the beam current of the ion beam 204. The ion beam 204 transported to a workpiece may be a spot beam or a ribbon beam based on the specific beamline architecture of the implanter 170. The spot beam may be a fixed or stationary spot beam without a scanner. Alternatively, the spot beam may be scanned by a scanner of the ion beam generator 202 for providing a scanned spot beam which may also be referred to as a scanned ribbon beam in some instances. The ion beam 204 may also be a ribbon beam having a long dimension at least as wide as a workpiece to be implanted. The ion beam 204 can also be any type of charged particle beam, such as an energetic ion beam.

The shield 150 may be fabricated of a variety of materials including, but not limited to, graphite, silicon, or silicon coated metal, in order to selectively block the ion beam 204.

The beam current sensor 242 is configured to sense a beam current of the ion beam 204 and in one embodiment may be a Faraday sensor as is known in the art.

In operation, the actuator 156 may provide mechanical force to translate the shield 150 relative to the beam current sensor 242. In one embodiment, the actuator 156 may translate the shield 150 along a translation path 172. The beam current sensor 242 may be positioned downstream from the shield 150 in a direction of travel of the ion beam 204. As used herein, "downstream" and "upstream" and are referenced in the direction of ion beam transport. In one embodiment, the translation path 172 may be in a substrate plane 158 where a substrate (not illustrated) would be supported during an implant of the ion beam 204 into the substrate. The substrate plane 158 may be used to define a coordinate system where the origin is at the center of a substrate positioned for ion implantation in the substrate plane 158, the X axis is horizontal and in the substrate plane 158, the Y axis is vertical and in the substrate plane 158, and the Z axis is perpendicular to the substrate plane 158 in the direction of travel of the ion beam 204.

The shield 150 is configured to block at least a portion of the ion beam 204 from the beam current sensor 242 as the shield is translated along the translation path 172. The beam current sensor 242 may be designed to measure the total beam current at any location (X or Y). The shield 150 may be moved in a manner wherein a portion of the shield blocks a different portion of the beam current sensor 242 from the ion beam 204 as the shield is translated along the translation path 172. Measured values of the beam current associated with changes in position of the shield 150 along the translation path 172 are representative of a beam current density distribution of the ion beam 204 in the beam current sensor area blocked or unblocked by the motion of the shield 150 along the translation path 172.

The beam current sensor 242 may have a long and short dimension. The long and short dimensions may be defined by the sensor itself. Alternatively the long and short dimensions may be defined by a slot in a shield (not illustrated) positioned upstream from a larger beam current sensor having similar dimensions as the shield. In one embodiment, the long dimension of the sensor 242 may be aligned in the Y direction and the translation direction 172 may be in the X direction such that the ion beam current density measurement system 240 may provide a beam current density distribution of the ion beam in the Y direction. In another embodiment, the long dimension of the sensor 242 may be aligned in the X direction and the translation path 172 may be in the Y direction such that the ion beam current density measurement system 240 may provide a beam current density distribution of the ion beam in the X direction. The beam sensor 142 of FIG. 1 may also similarly have a long and short dimension.

Figure 2:
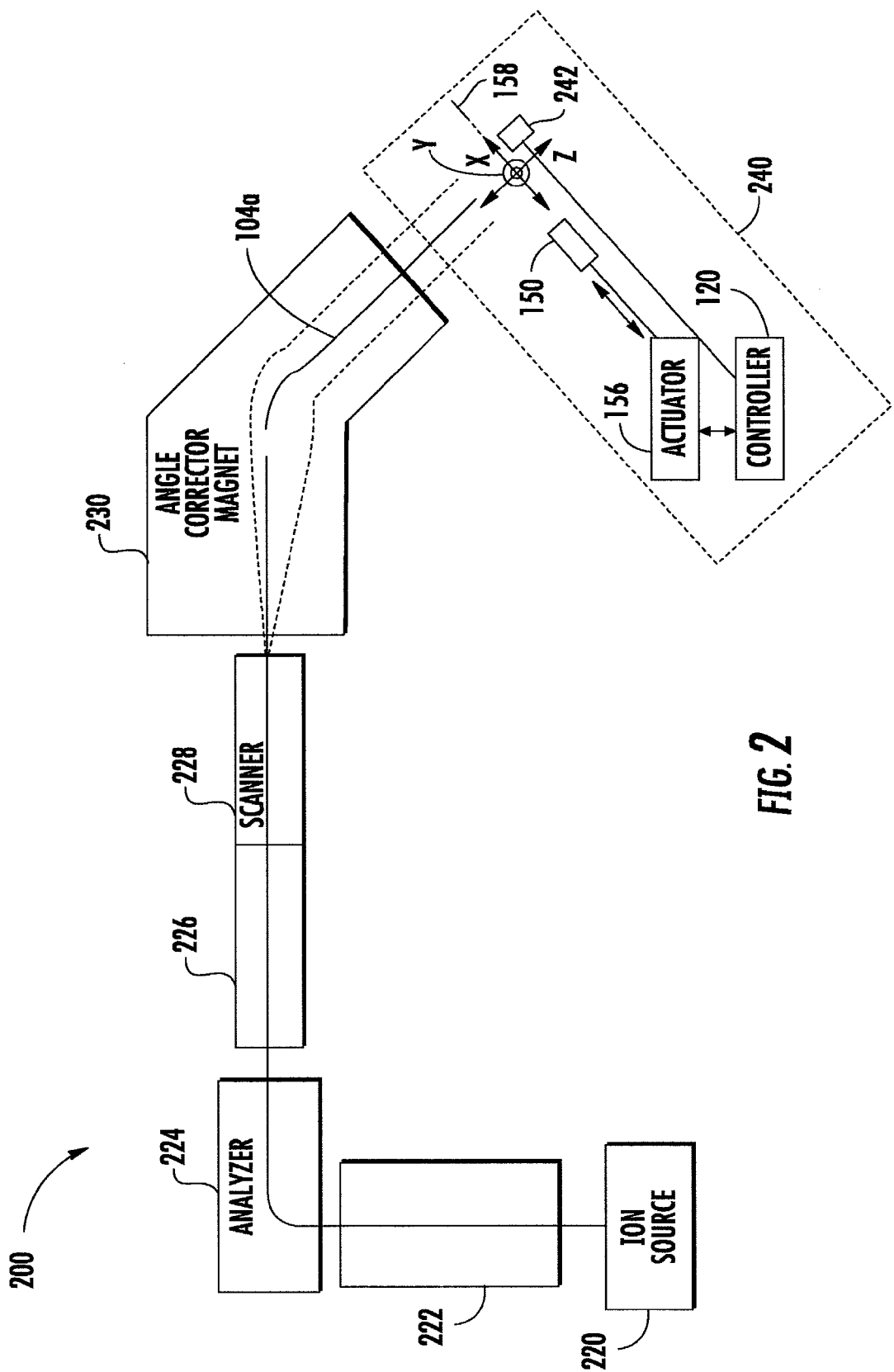
FIG. 2 is a schematic diagram of one embodiment of an ion implanter including an ion beam current density measurement system consistent with an embodiment of the invention.

Turning to FIG. 2, a block diagram of an ion implanter 200 including an ion beam current density measurement system 240 consistent with an embodiment of the invention is illustrated. Many other ion implanters will be known to those skilled in the art and the embodiment of FIG. 2 is provided by way of example only and is not intended to be limiting. Components of FIG. 2 similar to components of FIG. 1B are similarly labeled and hence any repetitive description is omitted herein for clarity. The ion implanter 200 may include an ion source 220, an extraction electrode set 222, a mass analyzer 224, a resolving aperture 226, a scanner 228, and an angle corrector magnet 230.

The ion source 220 may generate ions and may include an ion chamber and a gas box containing a gas to be ionized. The gas may be supplied to the ion chamber where it is to be ionized. The ions thus formed may be extracted from the ion source 220. The extraction electrode 222 and an extraction power supply may accelerate ions from the ion source. The extraction power supply may be adjustable as controlled by the controller 120. The construction and operation of ion sources are well known to those skilled in the art.

The mass analyzer 224 may include a resolving magnet that deflect ions so that ions of a desired species pass through the resolving aperture 226 and undesired species do not pass through the resolving aperture 226. In one embodiment, the mass analyzer 224 may deflect ions of the desired species by 90 degrees. The scanner 228 may be positioned downstream from the resolving aperture 226 to scan the ion beam in at least one direction. The scanner 228 may be an electrostatic scanner or a magnetic scanner as are known in the art.

The angle corrector magnet 230 may deflect ions of the desired ion species to convert a diverging ion beam from the scanner 228 to a nearly collimated ion beam having substantial parallel ion trajectories. Such an ion beam 204 may be referred to as a scanned spot beam or a scanned ribbon beam. In one embodiment, the angle corrector magnet 230 may deflect ions of the desired ion species by 45 degrees.

The actuator 156, shield 150, and beam current sensor 242 of the ion beam current density measurement system 240 may be located in an end station of the ion implanter 200. The end station may include other components known in the art such as a platen to support a wafer and a platen drive system to drive the platen and hence the wafer in a desired way.

Figure 3:
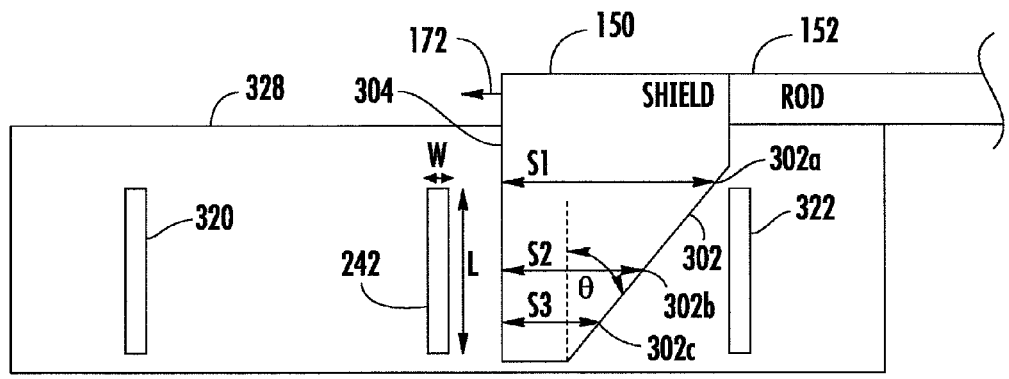
FIG. 3 is a front view of the shield used in the ion beam current density measurement system of FIG. 1B.

FIG. 3 is a front view of the shield 150 that may be utilized in the ion beam current density measurement system 240. Other shield embodiments are possible and the shield 150 is illustrated by way of example only and is not intended to be limiting. The shield 150 is viewed in the positive Z direction, i.e., in the downstream direction of the ion beam 204. The shield 150 may be any element that blocks the ion beam 204 and may be fabricated of a variety of materials including, but not limited to, graphite, silicon, and silicon-coated metal.

The shield 150 may have a first feature and a second feature, where the second feature has a variable spacing from the first feature as a function of location of the second feature. In the embodiment of FIG. 3, the first feature may be a straight outside edge 304 oriented at an orthogonal angle to the translation path 172, and the second feature may be a straight outside edge 302 oriented at a non-orthogonal angle to the translation path 172. Due to the variable spacing between each edge 304, 302 as a function of location on the edge 302, the outside edges 304 and 302 have a spacing S1 at location 302a on the edge 302, a spacing S2 at location 302b on the edge 302, and a spacing S3 at location 302c on the edge 302. In other shield embodiments, the outside edges 302, 304 may not be straight. In addition, the outside edges 302, 304 may be oriented at an acute angle θ with respect to each other. In one embodiment, the angle θ between the edges 302 and 304 may be between about 20 and 45 degrees.

A plurality of beam current sensors 320, 242, and 322 may be positioned downstream in the positive Z direction from the shield 150. Beam current sensor 242 may have a long dimension L and a short dimension W. The long dimension L may be aligned in the Y direction. In one embodiment, the plurality of beam current sensors 320, 242, and 322 may be Faraday sensors such as dose Faraday sampling cups positioned in a beam stop 328.

Figure 4:
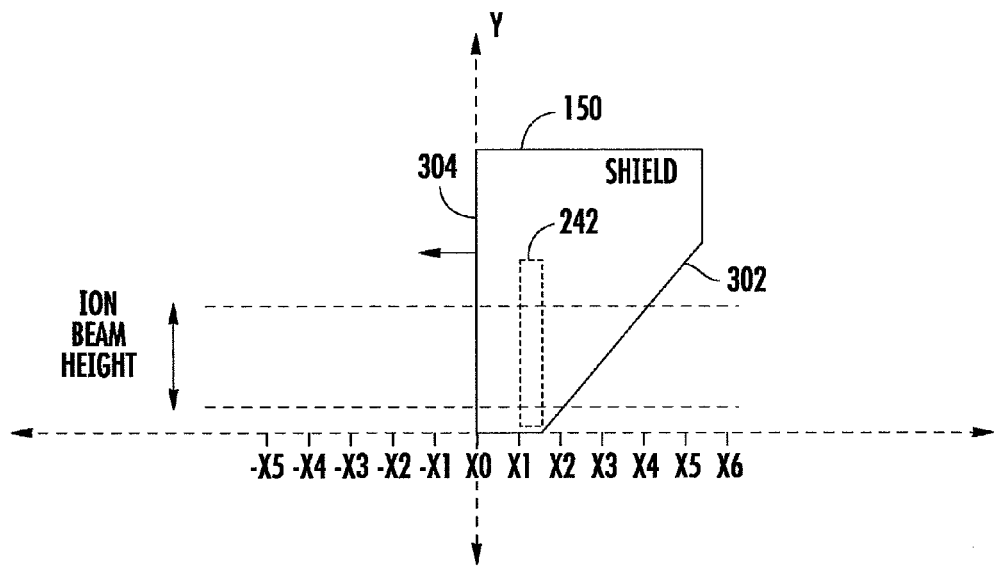
FIG. 4 is a front view of the shield of FIG. 3 in a first position relative to a beam current sensor.

FIG. 4 illustrates a front view of the shield 150 of FIG. 3 in a first position relative to the beam current sensor 242. The shield 150 may be translated in the negative X direction such that outside edge 304 of the shield 150 orthogonal to the translation path 172 is the leading edge and the other outside edge 302 is the trailing edge. The translation of the shield 150 along the translation path 172 may be continuous or in discrete steps. When the leading edge 304 is at position X0, the shield 150 may completely block the ion beam 204 from the beam current sensor 242.

Figure 5:
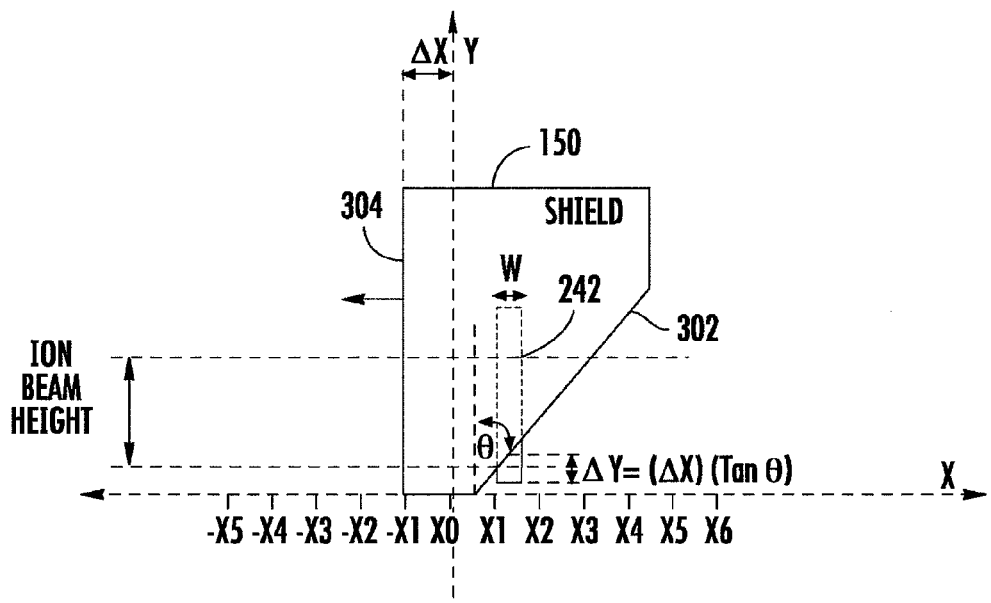
FIG. 5 is a front view of the shield of FIG. 3 in a second position relative to the beam current sensor.

FIG. 5 illustrates a front view of the shield of FIG. 3 in a second position relative to the beam current sensor 242. Compared to the first position of FIG. 4, the shield 150 has been translated a distance ΔX so that the leading edge 304 is now at position −X1. Since the distance ΔX is known and the geometry of the shield 150 is known, a corresponding change in Y positions or ΔY of an unmasked area of the beam current sensor 242 can be determined from equation (1).

$$\Delta Y=(\Delta X)(\tan \theta) \quad (1)$$

In equation (1), ΔX is the change in the position of the shield 150 along the X direction, and θ is the angle between the edges 304 and 302.

Figure 6:
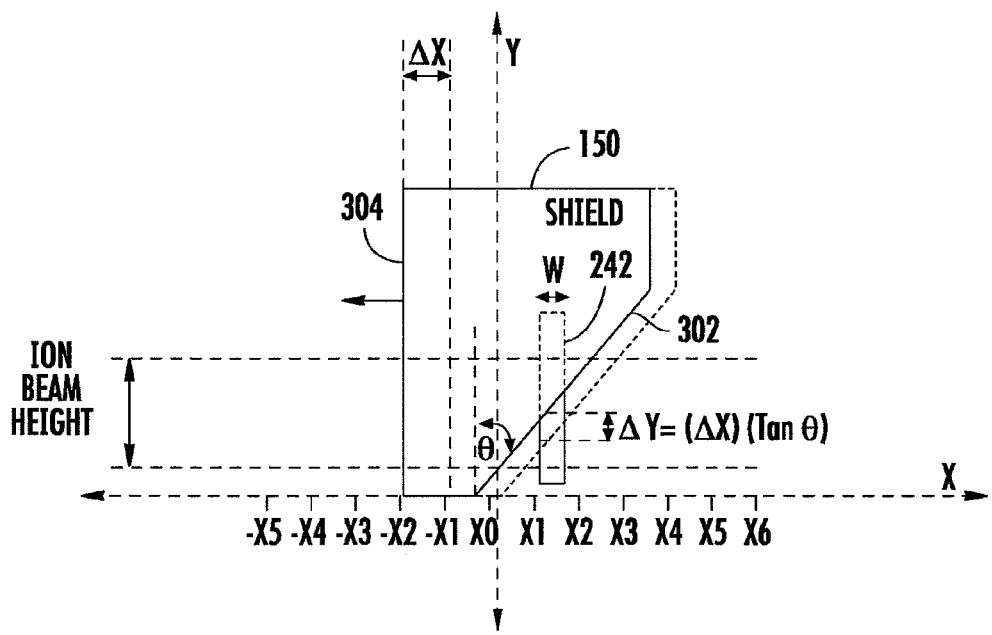
FIG. 6 is a front view of the shield of FIG. 3 in a third position relative to the beam current sensor.

FIG. 6 illustrates yet another front view of the shield of FIG. 3 in a third position relative to the beam current sensor 242. Compared to the second position of FIG. 5, the shield has been translated a similar distance ΔX so that the leading edge 304 is now at position −X2. Accordingly, the trailing edge 302 of the shield 150 unmasks an additional vertical distance ΔY of the beam current sensor 242. Thus, a greater portion of the ion beam (in the vertical direction) may be sensed by the beam current sensor 242 compared to the previous position depending on the position and height of the ion beam. The shield 150 may continue to be translated until the trailing edge 302 does not block any portion of the ion beam from the beam current sensor 242.

Therefore, as the shield 150 is translated in the negative X direction, the masked area of the beam current sensor 242 changes. The changes in the masked area of the beam current sensor due to the edge 302 result in changes to the measured beam current by the beam current sensor 242 which can be utilized to determine a vertical beam current density distribution in the Y direction since the long dimension L of the beam current sensor 242 is aligned in the Y direction.

Figure 7:
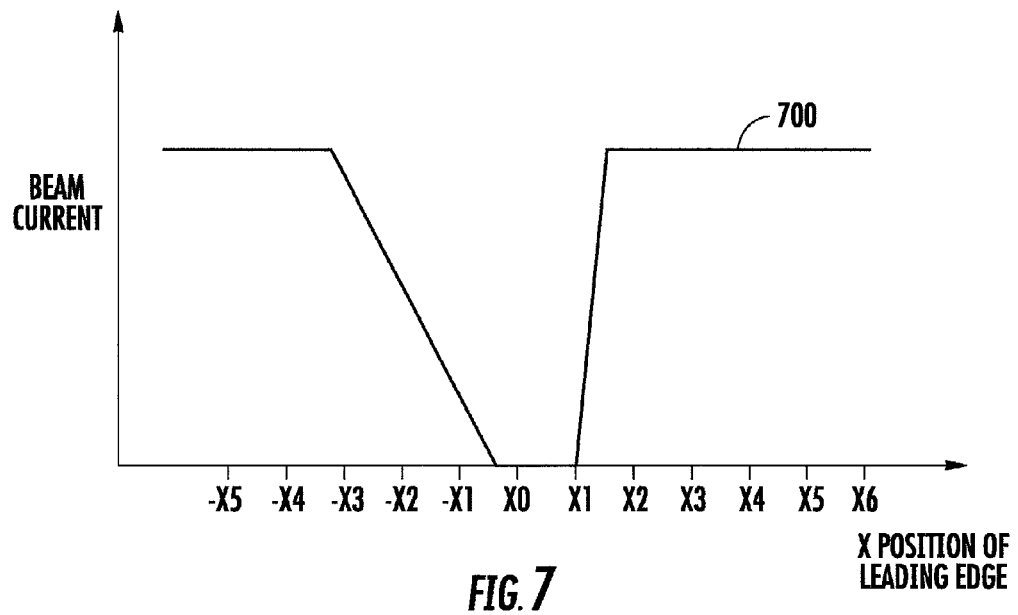
FIG. 7 is a plot of beam current as a function of horizontal shield positions of the shield of FIG. 3.

FIG. 7 illustrates a plot 700 of beam current measured by the beam current sensor 242 as a function of shield positions for different horizontal X positions of the shield 150. The X coordinates correspond to positions of the leading edge 304 of the shield 150. As the leading edge is translated in the negative X direction it blocks the ion beam from the ion beam sensor 242 about when it reaches the X1 position. Hence, the ion beam current sensed by the beam current sensor 242 falls rapidly as until it reaches about 0 at position X1. The beam current measured by the beam current sensor remains at about 0 until the trailing edge 302 begins to unmask an area of the beam current sensor 242 at which a portion of the ion beam is directed. This occurs about midway between positions X0 and −X1. The trailing edge 302 unmasks more of the beam current sensor 242 and comparatively larger amounts of total beam current are measured until the leading edge reaches about position −X3 where the total height of the ion beam is now measured by the beam current sensor 242.

Figure 8:
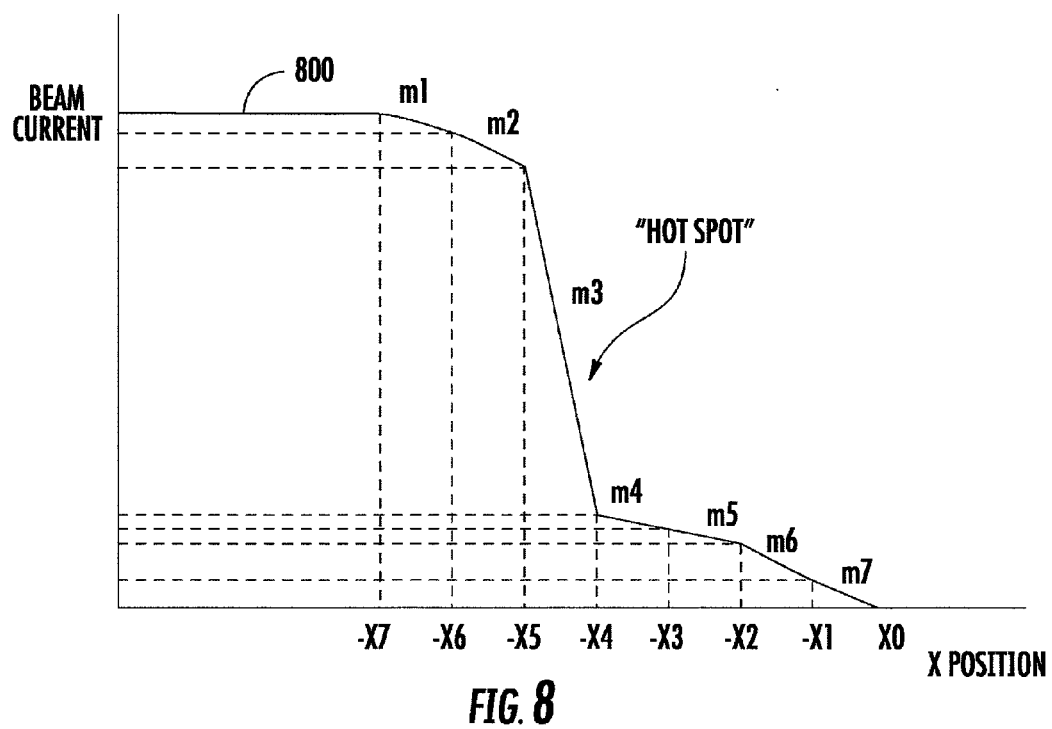
FIG. 8 is a more detailed plot of beam current as a function of shield positions for a shield consistent with the shield of FIG. 3.

FIG. 8 is a plot 800 of beam current as a function of shield X positions illustrating a portion of measured beam current associated with the edge 302 unmasking the ion beam sensor 242 as it is translated in the negative X direction. In the example of FIG. 8, the total beam current at equidistant X positions is plotted. Hence, the rate of change of the measured beam current directly affects the slope of the plot 800. In general, the greater the slope of the plot 800, the higher the beam current attributable to that particular Y region of the ion beam current sensor. An excessive slope, e.g., slope m3 between X positions −X5 and −X4, compared to a threshold may be indicative of a "hot spot" of the ion beam in that particular Y region associated with the X positions of the shield. A controller of the ion beam current density measurement system may take corrective action if a portion of the measured beam current density in the Y direction exceeds a threshold. The correction action may include preventing ion implantation into a substrate. If a portion of the measured beam current density exceeds the threshold, the resulting dose rate may be higher than an acceptable dose rate.

Figure 9:
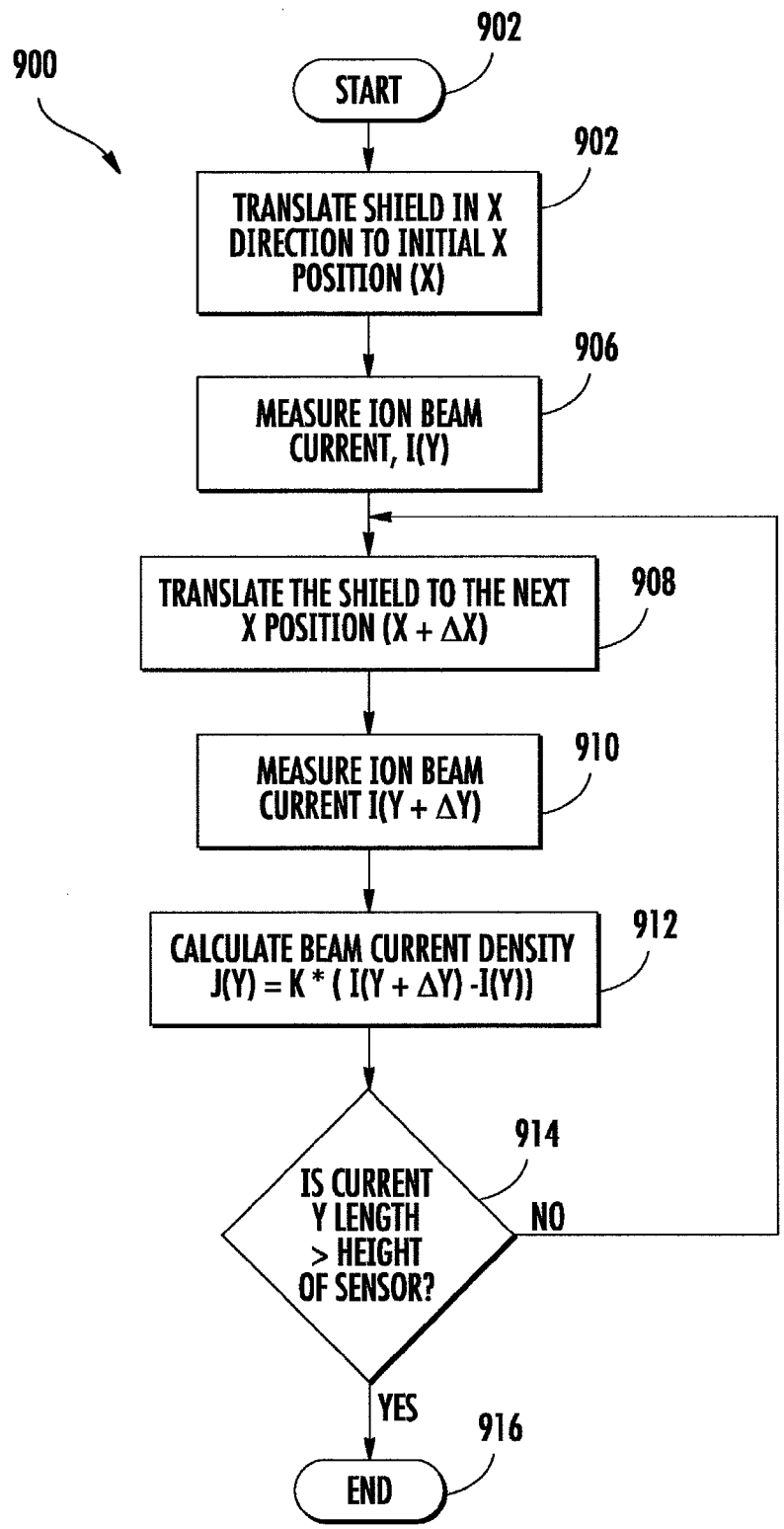
FIG. 9 is a flow chart of operations for determining a vertical beam current density profile.

FIG. 9 is a flowchart 900 of operations consistent with an embodiment to determine a vertical beam current density in the Y direction as the shield is translated in the X direction. In this instance, the beam current sensor may have its long dimension oriented in the Y direction (see the beam current sensor 242 in FIG. 3 as an example). At the start of operations 902, the shield is translated in the X direction to an initial X position 904. The translation of the shield along the translation path may be continuous or in discrete steps. The ion beam current in the Y direction, I(Y), at this initial shield position may then be measured 906 by a beam current sensor. The initial ion beam current may be about zero in some embodiments if the shield completely blocks the ion beam from the beam current sensor at the initial position.

The shield may then be translated in an X direction to the next X position (X+ΔX) 908. The beam current in the Y direction may then be measured at this new X position. The beam current in the Y direction is equal to the initial beam current measurement, I(Y), plus any additional current measurement associated with a change, ΔY, of an area masked or unmasked by a feature of the shield. For example, as the angled outside straight edge 302 of the shield 150 is translated by the beam current sensor 242, additional portions of the ion beam unmasked by the edge 302 may be sensed by the beam current sensor 242.

The beam current density may then be calculated in response a change in the measured ion beam current between position or I(Y+ΔY)−I(Y). In particular, the beam current density may be given by equation (2) where K is a constant related to the geometry of the particular shield embodiment and beam current sensor.

$$J(Y)=K*I(Y+\Delta Y)-I(Y). \quad (2)$$

In equation (2), J(Y) is the beam current density for a particular range of Y values. K is a constant related to the particular geometry of the shield and beam current sensor, and I(Y+ΔY)−I(Y) is a change in measured ion beam current as a particular feature of the shield, e.g., the edge 302 of shield 150, is translated by the beam current sensor. For the system geometry having the shield 150 shield of FIG. 3 and the beam current sensor 242 having a width W, equation (2) may be expressed as equation (3).

$$J(Y)=2W(\Delta I(Y))/((\Delta X)(\Delta Y)) \quad (3)$$

In equation (3), W is the width of the beam current sensor 242 as illustrated in FIG. 5, ΔI(Y) is the change in beam current from a previous measurement at a previous Y position of a feature of the shield, e.g., the edge 302, ΔX is the distance the shield has been translated in the X direction from the last measurement, and ΔY=(ΔX)(tan θ) as detailed in equation (1) and illustrated in FIG. 5.

If the current Y length of the area of the beam current sensor unmasked or masked by a feature of the shield is less than the height of the beam current sensor, the shield continues to be translated across the width of the beam current sensor 914. If the current Y length becomes greater than the height of the beam current sensor, the operations end 916. The operations 900 of FIG. 9 to determine a vertical beam current density in the Y direction can be utilized for differing ion beams. The operations of FIG. 9 can also be combined with other operations that determine a horizontal beam current density in the X direction to produce two dimensional beam current profile maps of beam current density values in both the X and Y directions.

Figure 10:
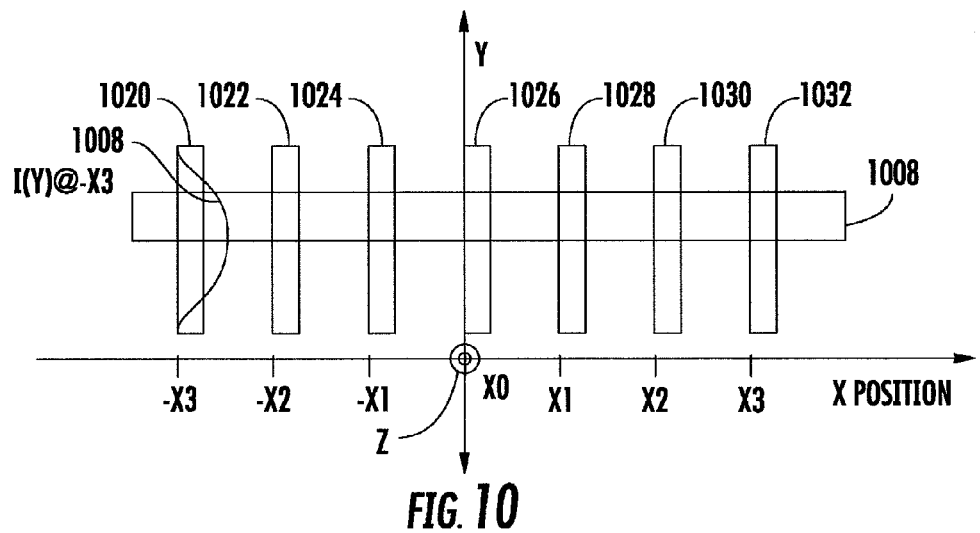
FIG. 10 is a schematic view of a cross section of a ribbon beam incident on a plurality of beam current sensors.

FIG. 10 illustrates a front cross sectional view of a ribbon beam 1006 and a plurality of beam current sensors of an ion beam current density measurement system consistent with the invention. In the embodiment of FIG. 10, seven beam current sensors 1020, 1022, 1024, 1026, 1028, 1030, and 1032 are illustrated, although one or more beam current sensors may be utilized. For clarity of illustration, the shield 150 is omitted from FIG. 10. Each of the beam current sensors 1020, 1022, 1024, 1026, 1028, 1030, and 1032 may be fixed at a particular X location. As the shield 150 is translated along the translation path 172 past each beam current sensor, a vertical beam current density distribution in the Y direction may be developed for each sensor 1020, 1022, 1024, 1026, 1028, 1030, and 1032 by a method consistent with the operations detailed in FIG. 9. For instance, a vertical beam current density distribution 1008 in the Y direction [I(y)@ position −X3] may be developed for sensor 1020 and so on for each other sensor 1022, 1024, 1026, 1028, 1030, and 1032 at its respective X position.

Figure 11:
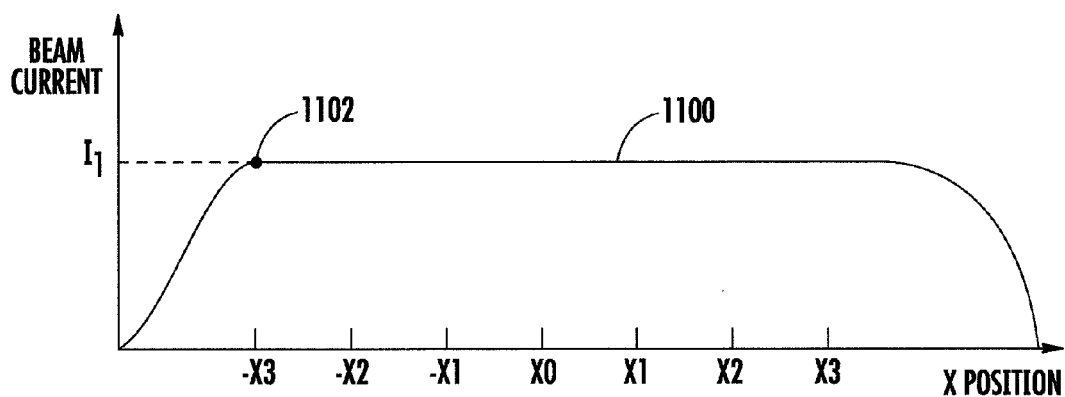
FIG. 11 is a plot of beam current versus a horizontal position for the ribbon beam of FIG. 10.

In addition to the vertical beam current density profiles for each beam current sensor, a plot 1100 of beam current versus X position for the ribbon beam 1006 may also be developed as illustrated in FIG. 11. The plot 1100 may be developed by translating a traveling profiler sensor, e.g., a traveling profiler Faraday sensor as is known in the art, in the X direction through the long dimension of the ribbon beam 1006. The shield 150 may be positioned away from the beam current sensors to not block any portion of the ion beam when the beam current density distribution plot 1100 in the X direction is being developed.

Figure 12:
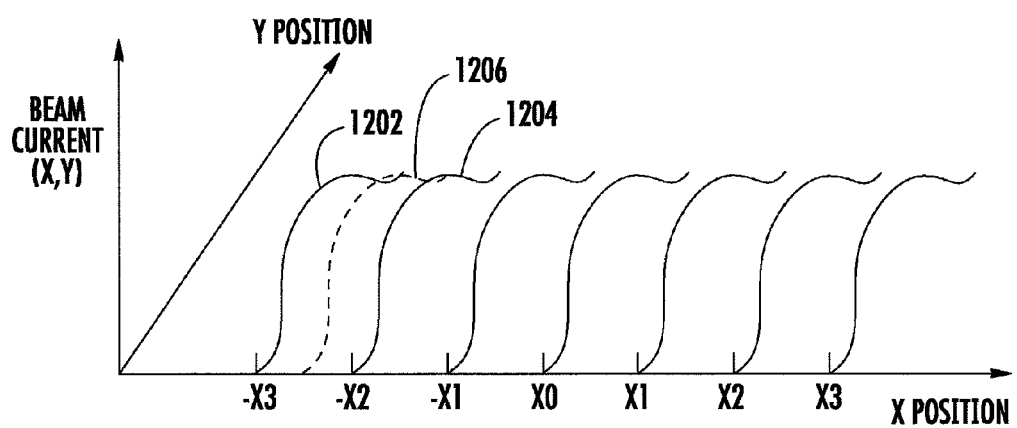
FIG. 12 illustrates plots of beam current density distributions in horizontal and vertical directions for the ribbon beam distributions of FIGS. 10 and 11.

With the total horizontal beam current density distribution plot 1100 and the vertical beam current density profiles, a two dimensional map of beam current densities in the X and Y directions may be developed, e.g., by the controller 120. FIG. 12 illustrates one way to develop such a map. The total beam current at each X location may be ascertained from the plot 1100 of FIG. 11. The total beam current may then be distributed about the Y axis according the respective vertical beam current profile by dividing the total beam current at the particular X location into the particular vertical beam current density profile. For example, the total beam current at the −X3 position for the first beam current sensor 1020 may be $I_1$ as illustrated by point 1102 on plot 1100. This total beam current $I_1$ may then be divided by the vertical beam current density profile 1008 to obtain a plot 1202. Similarly, a plot 1204 may be developed by dividing the total beam current the −X2 position by an associated vertical beam current density profile for beam current sensor 1022, and so on for each X location having an associated beam current sensor. Additional plots may then be calculated by linear interpolation, e.g., plot 1206 may be calculated from plots 1202 and 1204 using linear interpolation.

Figure 13:
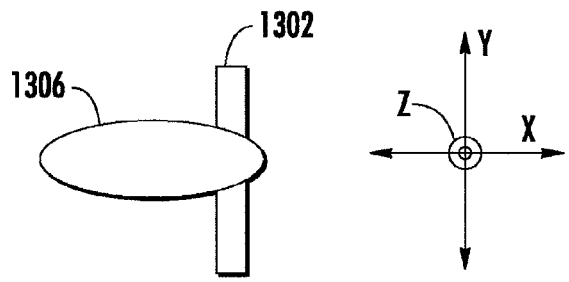
FIG. 13 is a schematic view of a cross section of a spot beam incident on a beam current sensor.

FIG. 13 illustrates a front cross sectional view of a spot beam 1306 and a beam current sensor 1302 of an ion beam current density measurement system consistent with the invention. For clarity of illustration, the shield 150 is omitted from FIG. 13. As the shield 150 is translated along the translation path 172 past the beam current sensor 1302, a vertical beam current density distribution in the Y direction may be developed by a method consistent with the operations detailed in FIG. 9. For instance, a vertical beam current density distribution in the Y direction may be developed as detailed by plot 1400 of FIG. 14. The plot 1400 may be developed by scanning the entire spot beam across the beam current sensor 1302 as the shield is translated past the beam current sensor so that the resulting plot 1400 is an average Y distribution for the entire spot beam. The speed of the scanning of the spot beam may be much faster than the speed of translation of the shield. The height H1 of the spot beam may also be ascertained by the controller 120 from the plot 1400 as the distance between the two points Y1 and Y2. Points Y1 and Y2 are also representative of the vertical positioning of the spot beam along the Y direction.

Figure 15:
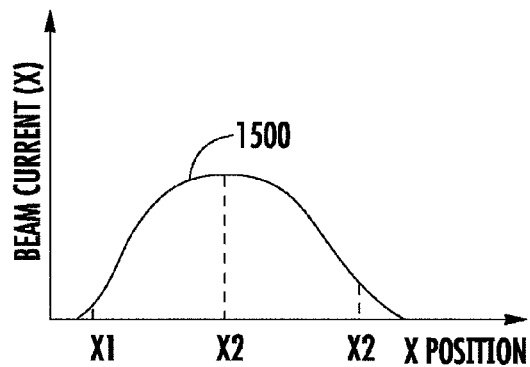
FIG. 15 is a plot of beam current versus a horizontal position for the spot beam of FIG. 14.

FIG. 15 illustrates a plot 1500 of a horizontal beam profile along the X direction. The plot 1500 may be developed by translating a traveling profiler sensor in the X direction through the entire spot beam 1306 with the shield 150 positioned away from the beam current sensor 1302 to not block any portion of the spot beam 1306.

Figure 16:
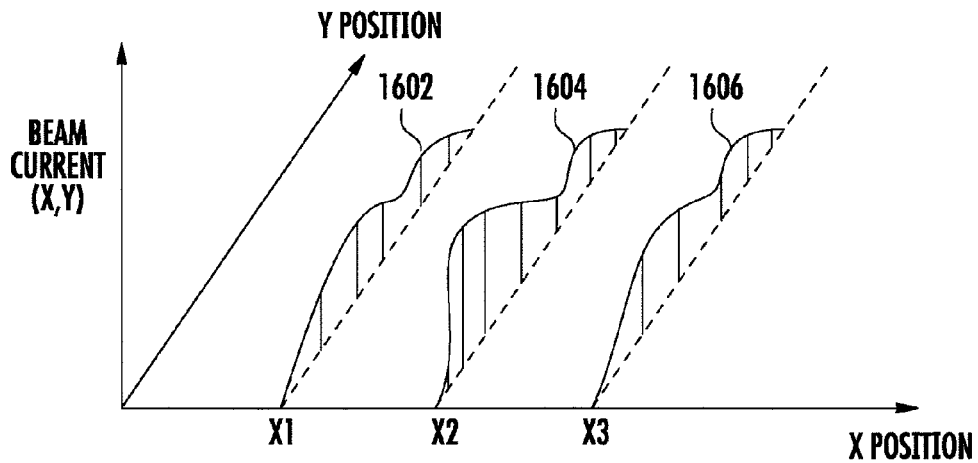
FIG. 16 illustrates plots of beam current density distributions in horizontal and vertical directions for the spot beam distributions of FIGS. 14 and 15.

FIG. 16 illustrates plots 1602, 1604, 1606 of the beam current plotted in both the X and Y directions. In one instance, plot 1602 may be developed by ascertaining the total beam current at the X1 position from the plot 1500 of FIG. 15 and dividing that total beam current by the vertical beam current profile for the spot beam 1306 as detailed by plot 1400 of FIG. 14. Similarly, plot 1604 and 1606 may be developed by dividing the total beam current at the X2 and X3 positions respectively by the same plot 1400. In this way, a two dimensional map of beam current densities in the X and Y direction for the spot beam 1306 may be developed.

Figure 14:
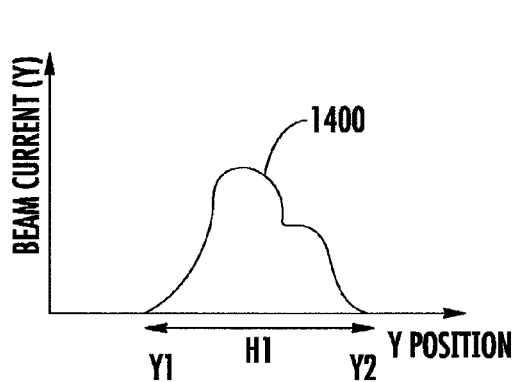
FIG. 14 is a plot of beam current versus a vertical position for the entire spot beam of FIG. 14.

Another way of developing a two dimensional map of beam current densities is to multiply two matrices. The first matrix may be an N row by 1 column matrix [N×1] having N rows of differing Y positions with one column of beam currents associated with each Y position. For example, FIG. 14 illustrates a plot 1400 of differing Y positions with associated beam currents for each Y position. The second matrix may be a 1 row by M column matrix [1×M] having 1 row of differing beam currents for associated X positions. A multiplication of these two matrices may yield an N row by M column [N×M] matrix representative of a two dimensional map of beam current densities in the X and Y direction for the spot beam 1406. In one embodiment, the controller 120 may perform such computations to provide the two dimensional map of beam current densities in the X and Y direction.

Figure 17:
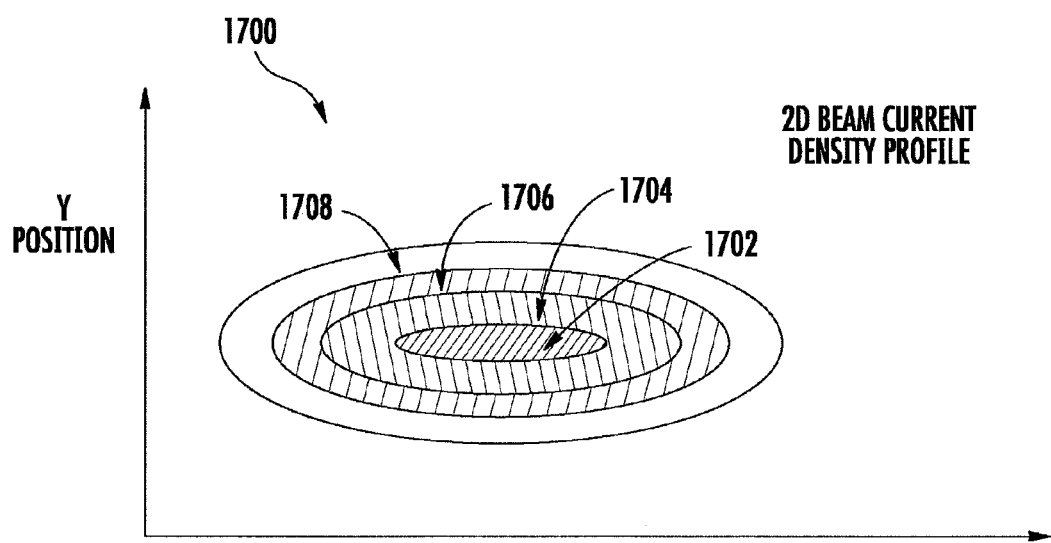
FIG. 17 is a graph of an exemplary two-dimensional map of beam current densities of a spot beam.

FIG. 17 illustrates an exemplary two dimensional map 1700 of beam current densities of a spot beam that may be calculated from a vertical and horizontal profile as determined similarly to profiles 1400 and 1500 of FIGS. 14 and 15. Region 1702 represents a first beam current range, region 1704 represents a second beam current range, region 1706 represents a third beam current range, and finally region 1708 represents a fourth beam current range. The first beam current range 1702 may be greater than the second range 1704, which in turn may be greater than the third range 1706, which yet in turn may be greater than the fourth range 1708. Although four beam ranges are illustrated for clarity, a two dimensional map of beam current densities may have any plurality of ranges depending on selected ranges and measured beam currents.

Figure 18:
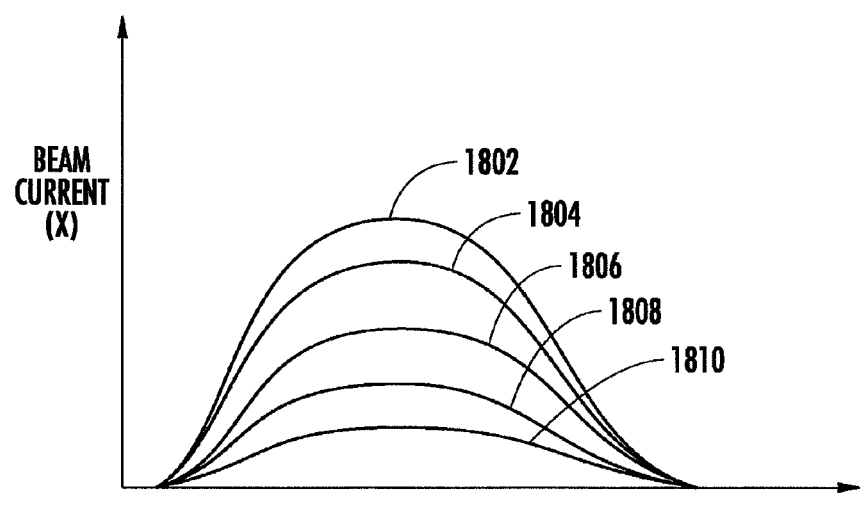
FIG. 18 is a plurality of plots of differing horizontal beam current density distributions for associated vertical positions of a shield.

Instead of measuring the total current in the beam current sensor as the entire spot beam is swept across the beam current sensor to achieve one vertical distribution plot such as plot 1400 of FIG. 14 and one horizontal distribution plot such as plot 1500 of FIG. 15 and then calculating a two dimensional map of beam current densities, a plurality of beam current distributions in the X direction can be developed as detailed in FIG. 18.

FIG. 18 illustrates a plurality of plots 1802, 1804, 1806, 1808, and 1810 of differing horizontal X beam current profiles for various Y positions of the shield 150. The shield may first be in a position that completely blocks the spot beam from the sensor. As the shield is translated across the beam current sensor, the shield may allow a greater and greater portion of the ion beam to be sensed by the beam current sensor as a feature of the shield, e.g., edge 302, translates past the beam current sensor. At a Y0 location of a feature of the shield, the entire spot beam may be scanned across the beam current sensor and plot 1810 may be developed. At another Y1 location of a feature of the shield, less of the spot beam may be blocked by the shield and plot 1808 may be measured as the entire spot beam is scanned across the beam current sensor. This process may continue for additional Y locations until the shield is no longer blocking any portion of the spot beam. In this way, a particular measured two dimensional beam current density distribution can be developed for a spot beam. Alternatively to measuring a beam current distribution in the X direction for differing Y positions of the shield, a plurality of beam current distributions in the Y direction for differing X positions of the shield may be developed.

Figure 19:
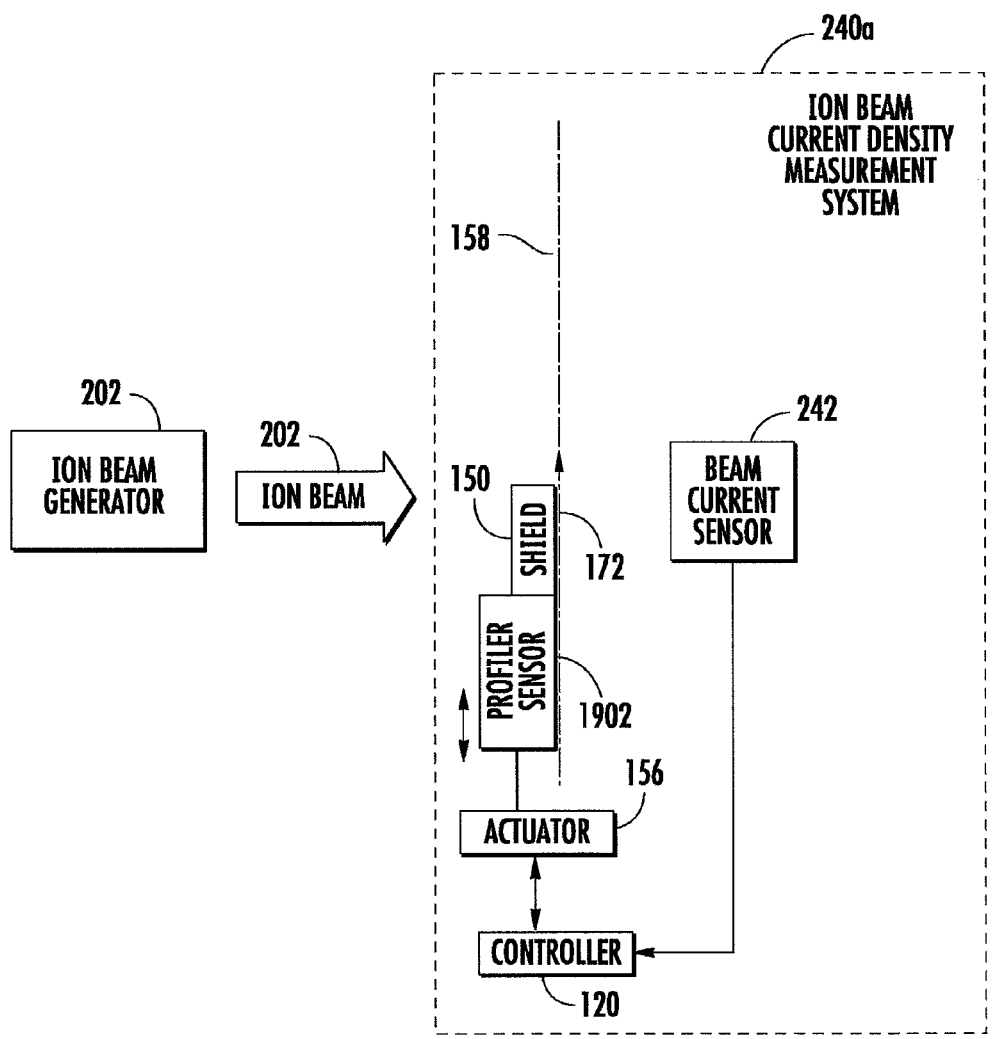
FIG. 19 is a first embodiment of an ion beam current density measurement system having a first shield and beam current sensor position.

FIG. 19 illustrates a first embodiment of an ion beam current density measurement system 240a consistent with the system 240 of FIG. 1B to illustrate a particular shield and beam current sensor position. The shield 150 may be coupled to a traveling profiler sensor 1902, e.g., a traveling Faraday sensor as is known in the art. The traveling profiler sensor 1902 and hence the shield 150 in this embodiment may travel in the substrate plane 158 defined by a substrate during an implant of the ion beam into the substrate. The beam current sensor 242 is positioned downstream in the Z direction from the shield. The beam current sensor 242 may be a sample Faraday sensor, e.g., a sample Faraday cup, that is positioned in an end station downstream from the substrate plane 158.

Figure 20:
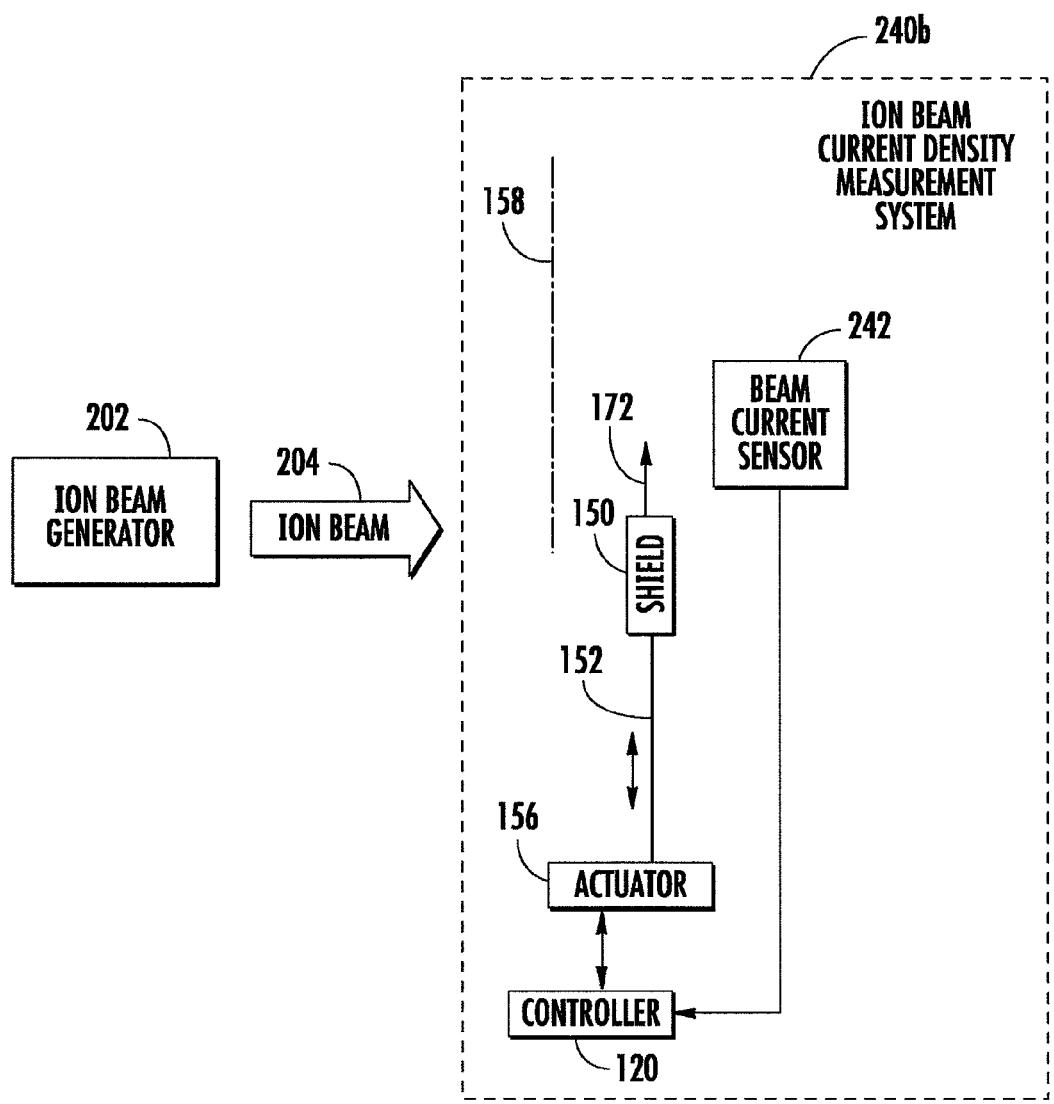
FIG. 20 is a second embodiment of an ion beam current density measurement system having a second shield and beam current sensor position.

FIG. 20 illustrates a second embodiment of an ion beam current density measurement system 240b where the shield 150 is positioned downstream from the substrate plane 158 in the direction of travel of the ion beam 204. The beam current sensor 242 may be a sample Faraday sensor, e.g., a sample Faraday cup, that is positioned in an end station downstream from the substrate plane 158.

Figure 21:
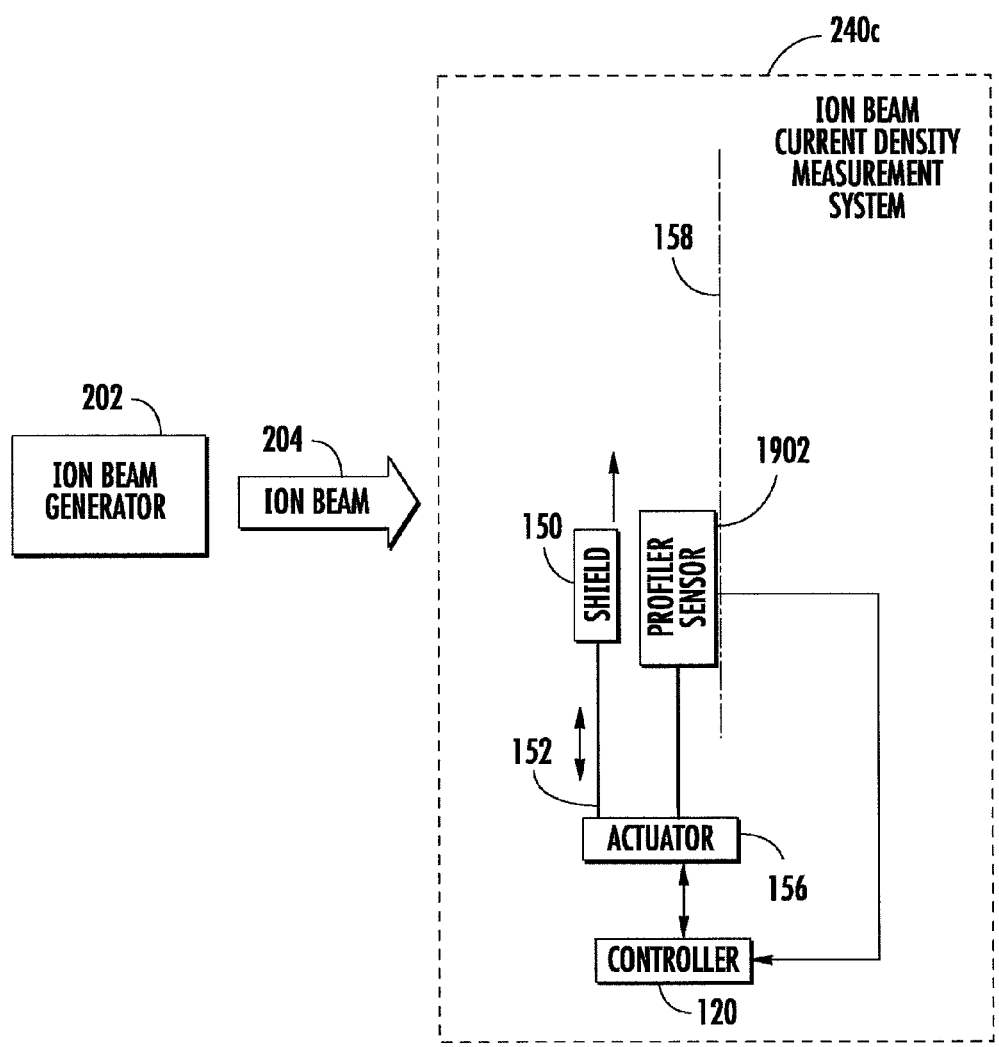
FIG. 21 is a third embodiment of an ion beam current density measurement system having a third shield and beam current sensor position.

FIG. 21 illustrates a third embodiment of an ion beam current density measurement system 240c where the beam current sensor may be the traveling profiler sensor 1902 positioned upstream from the substrate plane 158. The shield 150 may be positioned upstream from the traveling profiler sensor 1902 and hence also upstream from the substrate plane 158.

Figure 22:
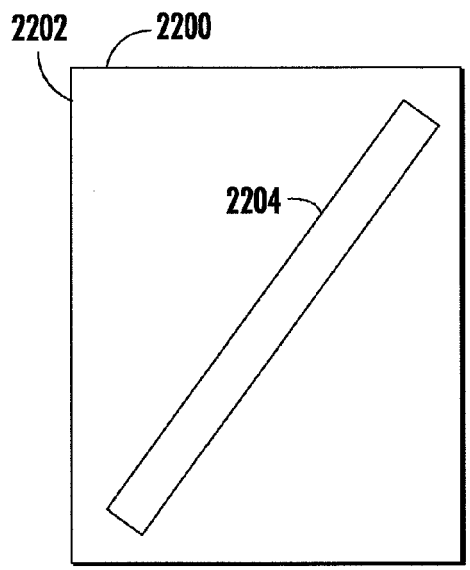
FIGS. 22-25 illustrate additional embodiments of shields consistent with the invention.
Figure 23:
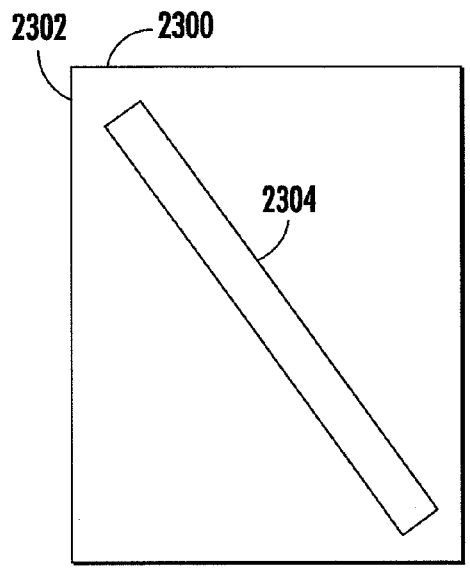
Figure 24:
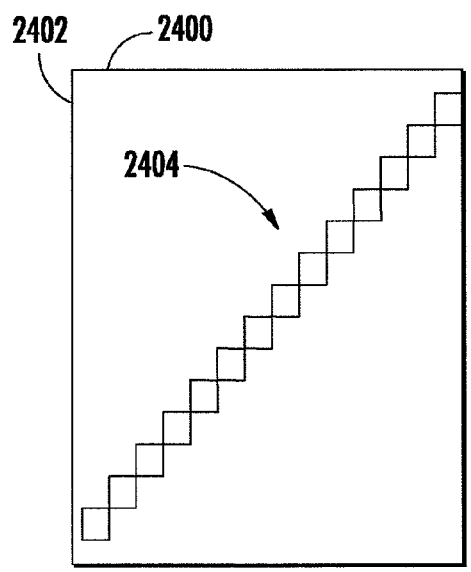
Figure 25:
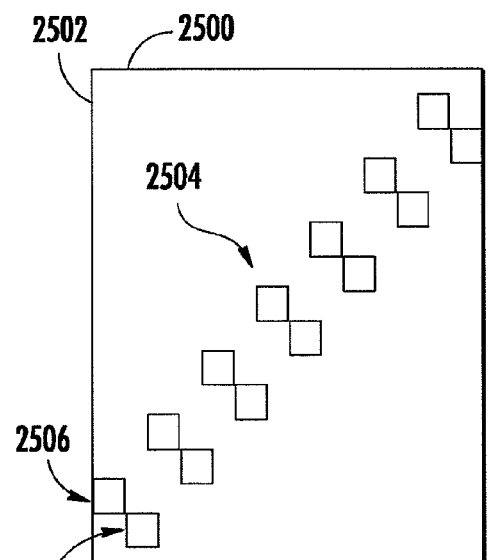

Other suitable shield embodiments are shown in FIGS. 22-25. As shown in FIG. 22, a shield 2200 includes a first feature in the form of a vertical outside edge 2202 and a second feature in the form of an angled slot 2204. As shown in FIG. 23, another shield 2300 includes a first feature in the form of a vertical outside edge 2302 and a second feature in the form of an angled slot 2304. FIG. 24 illustrates another shield 2400 having a first feature in the form of an outside edge 2402 and a second feature 2404 in the form of an array of rectangular openings. FIG. 25 illustrates yet another shield 2500 having a first feature in the form of an outside edge 2502 and a second feature 2504 in the form of another array of rectangular openings having two sets of rectangular openings 2506 and 2508 offset from each other in both a horizontal and vertical direction.

As the shield embodiments of FIGS. 22-25 are translated relative to a beam sensor, the vertical edge of the respective shields may first block the beam from the beam sensor. As the shields are further translated with respect to the beam, the associated openings in the shields permit the beam to pass through to the beam sensor. Therefore, as opposed to measuring changes in cumulative current as earlier detailed with the shield 150 embodiment of FIG. 3, the shields of FIGS. 22-25 can permit direct measurement of beam density in a direction defined by the long dimension of the associated beam sensor. For example, the shields of FIGS. 22-25 can permit direct measurement of vertical beam current density in the Y direction with an associated beam current sensor having a long dimension aligned in the Y direction, e.g., beam current sensor 242.

Advantageously, the beam density in a direction defined by the long dimension of the beam sensor can be readily determined. Only one direction of motion is required for determining profiles in two directions which simplifies associated mechanical drive systems such as a motor drive system. In addition, an ion beam current density measurement system can be readily incorporated into existing ion implanters. Furthermore, the use of a shield consistent with the invention is simpler, less costly, and less bulky than a conventional multipixel head with its associated hardware. A vertical beam current density distribution may also be used to determine a beam height of an ion beam in the vertical direction.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Other modifications, variations, and alternatives are also possible. Accordingly, the foregoing description is by way of example only and is not intended as limiting.

What is claimed is:

1. A beam density measurement system comprising:
   a shield;
   a beam sensor positioned downstream from said shield in a direction of travel of a beam, said beam sensor configured to sense an intensity of said beam, and said beam sensor having a long dimension and a short dimension; and
   an actuator to translate said shield relative to said beam sensor, wherein said shield blocks at least a portion of said beam from said beam sensor as said shield is translated relative to said beam sensor, and wherein measured values of said intensity associated with changes in a position of said shield relative to said beam sensor are representative of a beam density distribution of said beam in a first direction defined by said long dimension of said beam sensor.

2. The system of claim 1, wherein said beam comprises an ion beam, said beam sensor comprises a beam current sensor, said intensity comprises a beam current of said ion beam, and said beam density distribution comprises a beam current density distribution of said ion beam in said first direction.

3. The system of claim 2, wherein said actuator translates said shield along a translation path, and said long dimension of said shield is orthogonal to translation path.

4. The system of claim 3, wherein said shield has a first feature and a second feature, and wherein said second feature has a variable spacing from said first feature as a function of location on said second feature.

5. The system of claim 4, wherein said first feature comprises a straight outside edge oriented at an orthogonal angle to said translation path, and said second feature comprises a straight outside edge oriented at a non-orthogonal angle to said translation path.

6. The system of claim 3, further comprising a controller configured to receive a signal representative of a beam current density distribution of said ion beam in a direction of said translation path and to receive a signal representative of said beam current density distribution of said ion beam in said first direction, said controller further configured to develop a two dimensional map of said ion beam current in said direction of said translation path and said first direction.

7. The system of claim 2, further comprising a controller configured to receive a signal representative of said beam current density distribution of said ion beam in said first direction and configured to determine a height of said ion beam in said first direction in response to said signal.

8. The system of claim 2, further comprising a controller configured to receive a signal representative of said beam current density distribution of said ion beam in said first direction, said controller further configured to compare said beam current density distribution to a threshold and to take corrective action if a portion of said beam current density distribution exceeds said threshold.

9. An apparatus comprising:
a beam generator configured to generate a beam; and
a beam density measurement system comprising:
a shield;
a beam sensor positioned downstream from said shield in a direction of travel of said beam, said beam sensor configured to sense an intensity of said beam, and said beam sensor having a long dimension and a short dimension, and
an actuator to translate said shield relative to said beam sensor, wherein said shield blocks at least a portion of said beam from said beam sensor as said shield is translated relative to said beam sensor, and wherein measured values of said intensity associated with changes in a position of said shield relative to said beam sensor are representative of a beam density distribution of said beam in a first direction defined by said long dimension of said beam sensor.

10. The apparatus of claim 9, wherein said beam generator comprises an ion beam generator, said beam comprises an ion beam, said beam sensor comprises a beam current sensor, said intensity comprises a beam current of said ion beam, and said beam density distribution comprises a beam current density distribution of said ion beam in said first direction.

11. The apparatus of claim 10, wherein said ion beam comprises a spot beam, and wherein said beam current sensor provides said beam current density distribution of said spot beam in said first direction.

12. The apparatus of claim 10, wherein said ion beam comprises a spot beam, and wherein said beam current sensor provides said beam current density distribution of said spot beam in said first direction for each of a plurality of positions of said shield relative to said beam current sensor.

13. The apparatus of claim 10, further comprising a traveling profiler sensor, wherein said actuator translates said traveling profiler sensor along a translation path to provide a signal representative of a beam current density distribution of said ion beam in a direction of said translation path, and wherein said shield is coupled to said traveling profiler sensor, said traveling profiler sensor positioned upstream from a substrate plane defined by a substrate during an implant of said ion beam into said substrate, and said beam current sensor comprising a Faraday sensor positioned downstream from said substrate plane.

14. The apparatus of claim 10, wherein said shield is positioned downstream from a substrate plane defined by a substrate during an implant of said ion beam into said substrate, and said beam current sensor comprises a Faraday sensor positioned downstream from said substrate plane.

15. The apparatus of claim 10, wherein said shield is positioned upstream from a substrate plane defined by a substrate during an implant of said ion beam into said substrate, and said beam current sensor comprises a Faraday sensor of a traveling profiler sensor positioned upstream from said substrate plane.

16. A method comprising:
providing a beam sensor positioned downstream from a shield in a direction of travel of a beam, said beam sensor having a long dimension and a short dimension;
translating said shield relative to said beam sensor so that said shield blocks at least a portion of said beam from said beam sensor; and
measuring an intensity of said beam with said beam current sensor for different positions of said shield relative to said beam sensor, wherein measured values of said intensity associated with changes in a position of said shield relative to said beam sensor are representative of a beam density distribution of said beam in a first direction defined by said long dimension of said beam sensor.

17. The method of claim 16, wherein said beam comprises an ion beam, said beam sensor comprises a beam current sensor, said intensity comprises a beam current of said ion beam, and said beam density distribution comprises a beam current density distribution of said ion beam in said first direction.

18. The method of claim 17, wherein said translating comprises translating said shield along a translation path, and wherein said long dimension of said shield is orthogonal to translation path.

19. The method of claim 17, wherein said ion beam comprises a spot beam, and wherein said beam current sensor provides said beam current density distribution of said spot beam in said first direction for each of a plurality of positions of said shield along said translation path.

20. The method of claim 17, further comprising:
comparing said beam current density distribution of said ion beam to a threshold; and
taking corrective action if a portion of said beam current density distribution exceeds said threshold.

* * * * *